April 20, 1937. W. A. TOLSON Re. 20,338

TELEVISION SYSTEM

Original Filed April 30, 1932 2 Sheets-Sheet 1

Inventor
William A. Tolson

Attorney

TELEVISION SYSTEM
Original Filed April 30, 1932 2 Sheets-Sheet 2
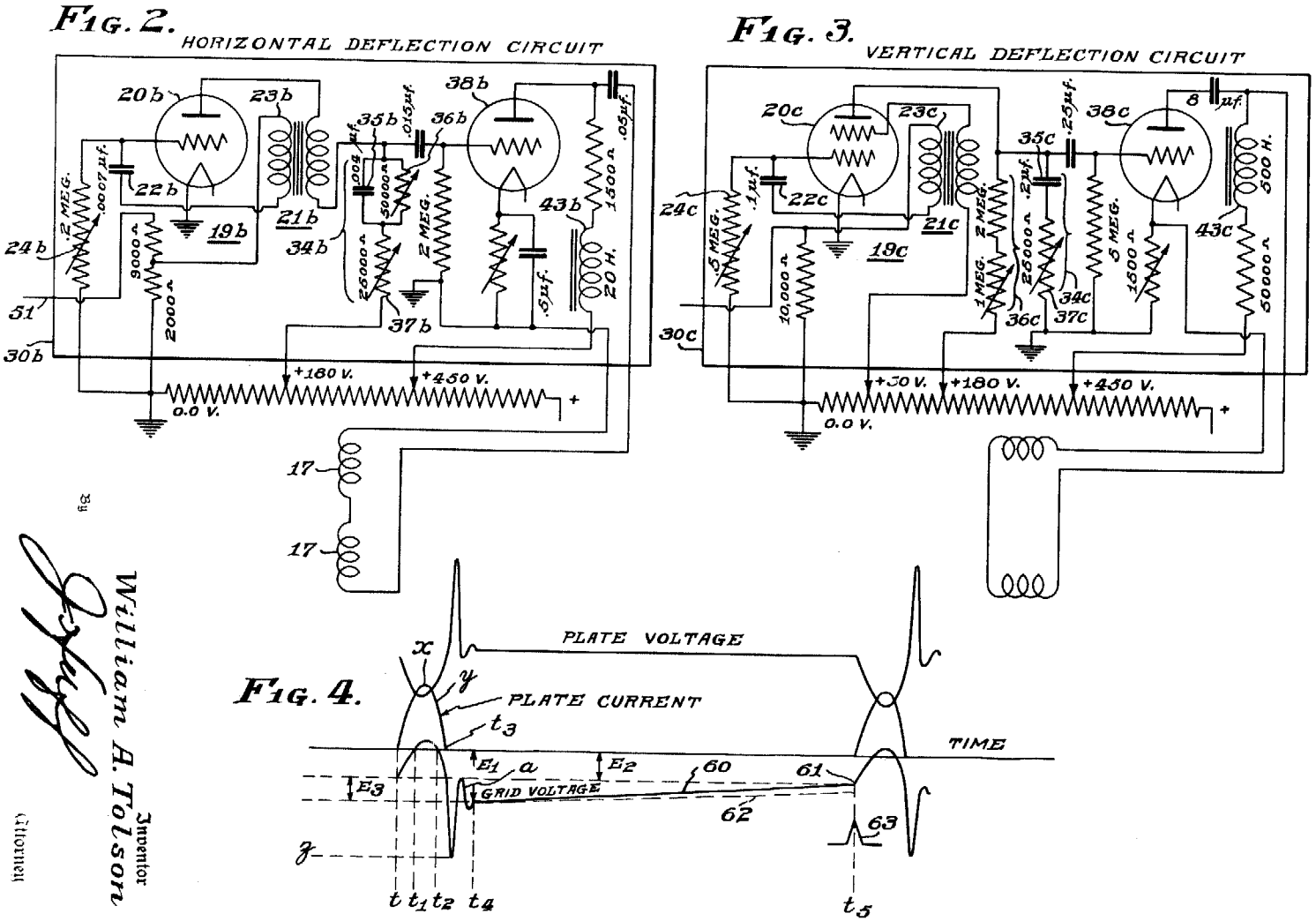
Inventor
William A. Tolson
By
Attorney Reissued Apr. 20, 1937

Re. 20,338

UNITED STATES PATENT OFFICE 20,338

TELEVISION SYSTEM

William A. Tolson, Merchantville, N. J., assignor to Radio Corporation of America, a corporation of Delaware Original No. 1,999,378, dated April 30, 1935, Serial No. 608,460, April 30, 1932. Application for reissue June 24, 1936, Serial No. 87,047

20 Claims. (Cl. 250—36)

Figure 1:
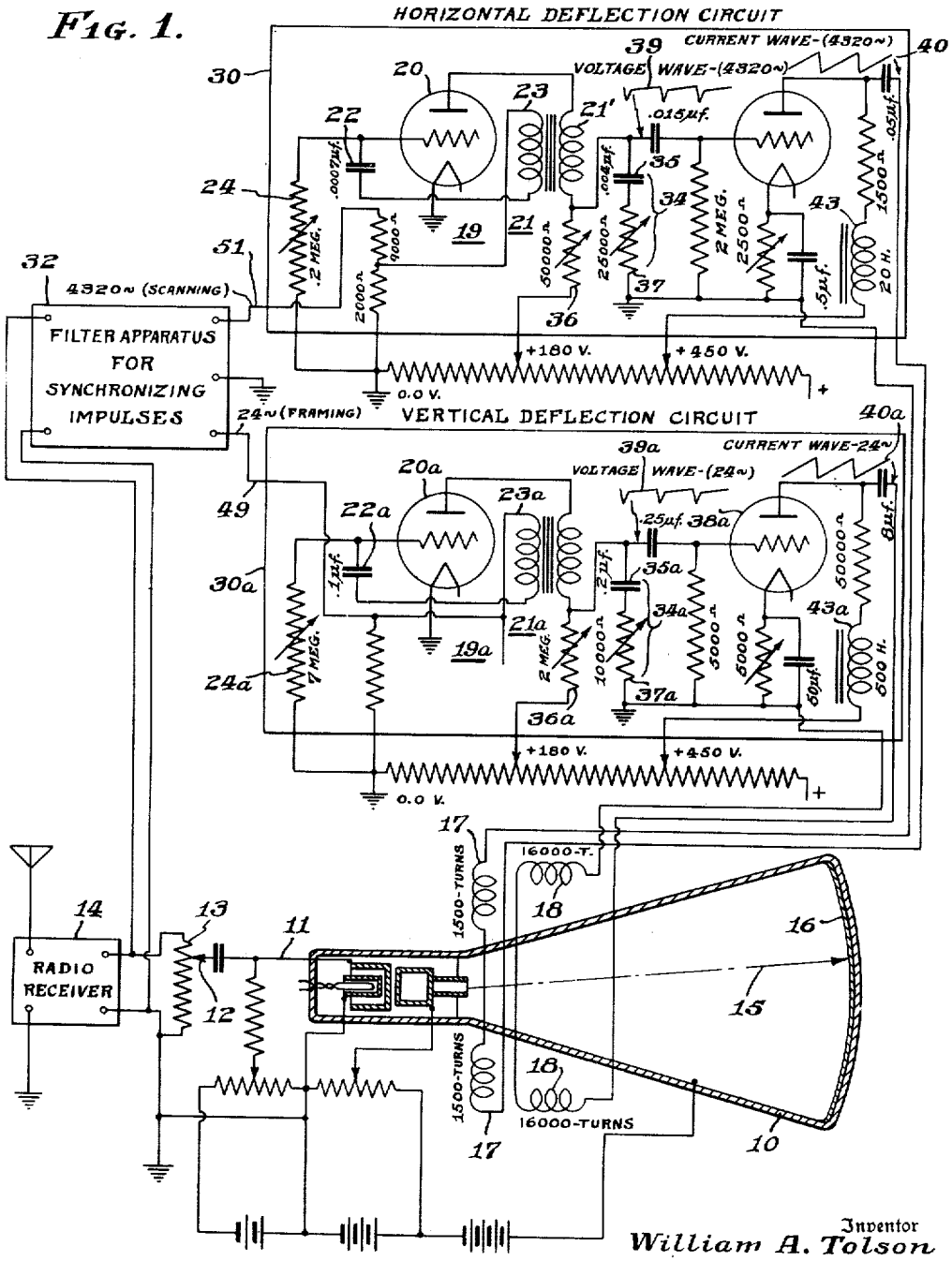

My invention relates to improvements in television systems embodying a cathode ray tube or other equivalent electron device at either or both the transmitting and receiving stations, and, more particularly, to improved apparatus for deflecting the electrons, in such tubes or devices, for scanning purposes.

Television receiving systems of the general character as that disclosed in the copending application by Arthur W. Vance, Serial No. 544,959, filed June 17, 1931, and assigned to the Radio Corporation of America, comprise a cathode ray tube with horizontal and vertical ray-deflecting coils, a horizontal deflection system for causing a saw-tooth current wave at the desired line-scanning frequency to pass through the horizontal ray-deflecting coils, and a vertical deflection system for causing a saw-tooth current wave at the desired framing frequency to pass through the vertical ray-deflecting coils.

For the purpose of synchronization, a dynatron oscillator is utilized to generate sharp voltage peaks, in the plate circuit thereof, and its oscillation frequency is locked in step with operating action at the transmitting station by transmitted synchronizing impulses which are applied to the grid circuit of the dynatron. The tips of the voltage peaks referred to, which occur at the ends of the scanning periods, are utilized to drive the horizontal deflection system which includes a condenser discharged by a tube having its grid circuit supplied from the plate circuit of the dynatron. The condenser-discharge tube is so biased that it draws plate current only at the level of the tips of the voltage peaks referred to.

While these systems have been found to lend themselves to satisfactory operation, a distinct operating disadvantage thereof resides in the fact that the frequency of oscillation of the dynatron oscillator is directly controlled by the applied plate and screen-grid voltages. Relatively small variations in supply voltages, therefore, are effective to change the frequency sufficiently to throw the system out of synchronism. Furthermore, in these systems, the deflecting circuits embody a relatively large number of tubes and, still further, adjustments for obtaining the desired wave shape are accompanied by some degree of frequency change. This necessitates other adjustments and readjustments until the desired operating conditions are obtained.

With the foregoing in mind, it is one of the objects of my invention to provide an improved television system of the character referred to embodying an oscillator circuit which not only generates a sharply-peaked output voltage wave, but which also maintains its required frequency of oscillations independently of occurring variations in the supply voltages over a range usually met with in practice.

Another object is the provision of an improved deflecting circuit particularly adaptable for causing a saw-tooth current wave to pass through electromagnetic deflecting coils for a cathode ray tube, which circuit comprises only two tubes for this purpose, and which can be adjusted to obtain the required wave shape without affecting the frequency of operation.

Other objects and advantages will hereinafter appear.

In accordance with my invention, for horizontal deflection of the cathode ray, a coupled oscillator tube is used. A resistance and a condenser are connected in the grid circuit, the capacity of the condenser being such that the charge which it stores up during the first oscillation is effective at substantially the completion thereof to block the tube against further oscillations by supplying a bias potential to the grid more negative than the cut-off potential.

At this point in the operating cycle, the resistance is effective to provide a leakage path for the charge, the rate of leakage, however, being such that the period of time elapsing before the bias becomes sufficiently less negative that it reaches a magnitude approximating that of the cut-off potential or slightly below it, is of the order of ten to twenty times the period of the first, single oscillation, the sum of the two periods being equal to a scanning-line period. There occurs, therefore, only a single, sharply-peaked current impulse in the plate circuit only once during each scanning-line period, and these are utilized to generate a saw-tooth current wave at the scanning-line frequency.

For vertical deflection of the cathode ray, a similar oscillation circuit is embodied in the vertical deflection system for generating a saw-tooth current wave at the framing frequency.

For the purpose of synchronization, the capacity of the blocking condenser and the value of the grid-leak resistance in each circuit are such that, at the end of the operating cycle, the bias on the grid is still slightly more negative than the bias necessary for cut-off, at which time a received synchronizing or framing impulse applied to the grid is effective to bring the bias at least to or slightly less than the cut-off potential. In this manner, the received synchronizing and framing impulses are effective to cause the operating cycles to begin at the same point at the end of each scanning-line period or each frame, as the case might be.

A television system constructed and operating in the specific manner just explained is disclosed in my copending joint application with Justin R. Duncan, filed February 27, 1932, and bearing Serial No. 595,484.

My invention resides in a system and method of operation of the character hereinafter described and claimed.

For the purpose of illustrating my invention, an embodiment thereof is shown in the drawings, wherein Figure 1 is a diagrammatic view of a television receiving system embodying my invention;

Figs. 2 and 3 are diagrammatic views showing modifications of the system illustrated in Fig. 1; and Fig. 4 is a graphical illustration of the principle of operation in Figs. 1 to 3.

In Fig. 1, the various parts, circuits and connections have, for convenience of comparison, been designated by the same reference numerals designating the respective and corresponding parts, circuits and connections in my copending application referred to.

The particular embodiment of my invention shown in Fig. 1 comprises a cathode ray tube 10 having its control-grid circuit supplied with picture signals by way of a connection 11 terminating at an adjustable contact 12 associated with a resistance 13, the latter being connected across the output of a suitable radio receiver 14.

A cathode ray 15 is caused to scan a fluorescent screen 16 by electromagnetic coils 17 for deflecting the ray horizontally, and by electromagnetic coils 18 for deflecting the ray vertically. For this purpose, the horizontal reflection circuit shown, and designated generally by the reference numeral 30, generates a saw-tooth current wave at a suitable line-scapping frequency, for example, 4320 cycles for a picture having 180 lines and for 24 frames a second, and supplies this wave to the coils 17. In like manner, the vertical deflection circuit shown generates a saw-tooth current wave at the framing frequency, for example, 24 cycles, and supplies this wave to the coils 18.

The horizontal deflection circuit includes an oscillator circuit 19 comprising an electron tube 20 and a transformer 21, preferably having an iron core as indicated on the drawings, providing an inductive coupling between the plate and grid circuits. A blocking condenser 22 is connected as shown between the grid of the tube 20 and the grid winding 23 of the transformer. An adjustable resistance 24 provides a leakage path to ground for the electrical charge stored in the condenser 22, as will hereinafter more fully appear.

The manner of operation of the oscillator circuit 19 will now be explained. At the start of the operating cycle, the plate current increases, and the polarity of the grid winding 23 of the oscillation transformer is such that the grid is then driven positive. This action is effective to increase the plate current still further until a condition of saturation is reached, after which the plate current begins to decrease. From this point, the plate current decreases almost instantaneously to zero by reason of the fact that, at the instant the plate current begins to decrease, the polarity of the grid is reversed by the action of the transformer windings 21' and 23 with respect to each other. This drives the grid almost instantaneously to a negative potential far below that necessary for cut-off.

During the action just described, the grid draws current for a very short period, and a negative charge is, accordingly, stored in the condenser 22. The charge stored by the condenser is not appreciably affected by the resistance 24 because the latter is relatively high compared to the resistance between the grid and cathode. The negative charge stored in the condenser blocks the tube against further oscillation, because this charge places on the grid a negative potential much greater than that required for cut-off. This negative charge, therefore, must be reduced by leakage through the resistance 24, before the plate can again begin to draw current to start the next cycle of operation. The time required for this discharge is determined by the ratio existing between the value of the resistance 24 and the capacity of the condenser 22. This ratio is made such that, at the end of the complete operating period, which equals a scanning-line period, the charge will not have leaked off sufficiently to reduce the negative bias quite to a potential such that the plate can again begin to draw current. At this instant, however, a sharp synchronizing impulse is received, and this is effective to counteract the bias potential on the grid sufficiently to permit space current to flow, thus initiating the next succeeding operating cycle.

By exciting the grid circuit from the plate circuit, and by using the proper values of capacity and resistance, the oscillator circuit is permitted to make only one oscillation during each complete operating period. Only a single, sharp impulse of current therefore passes through the plate circuit during each complete operating period, and this impulse, under the control of the received synchronizing impulses, always occurs exactly during the same part of the operating periods. In the particular embodiment shown, the capacity of the blocking condenser 22 and the value of the associated resistance 24 are such that the period during which the plate of the tube 20 draws current is about one-tenth of the entire operating period of the oscillator circuit.

The operation of the oscillator, which is similar to the operation of the oscillator described in the above-mentioned Tolson and Duncan application, may be better understood by referring to the curves in Fig. 4. At the start of the operating cycle at the time $t$, the plate current increases, and the polarity of the grid winding 23 of the oscillation transformer is such that the grid is then driven positive. This action is effective to increase the plate current still further until a maximum value is reached at the point $x$, after which the plate current decreases to zero, by reason of the fact that, at the instant the plate current begins to decrease at the point $y$, the polarity of the grid is reversed by the action of the transformer windings 21' and 23 with respect to each other. This drives the grid almost instantaneously to a negative potential far below that necessary for cut-off, that is, to the relatively large negative potential $z$.

The potential $z$ is a transient potential, due to the sharp decrease of plate current, and the grid potential, therefore, returns along a transient path $a$, to a value E1 corresponding to the negative charge stored in the condenser 22 from the time $t_1$ to the time $t_2$. That is, from the time $t_1$ to the time $t_2$, the grid draws current and, during this period, a negative charge is stored in the condenser 22. The charge stored by the condenser is not appreciably affected by the resistance 24 because the latter is relatively high compared to the resistance between the grid and cathode. E2 is the negative voltage required on the grid to prevent flow of plate current. Therefore, the difference between E1 and E2, or E3, is the voltage by which the negative charge on the grid side of the condenser 22 must be reduced before the plate can again begin to draw current to start the next cycle of operation.

It should be noted that the transient path *a* is a highly damped sine wave, the period of the wave being determined by the natural period of the transformer windings and the damping being provided by the iron core of the transformer. The voltage on the grid during the flow of plate current, that is, between $t$ and $t_3$, is substantially one-half of a sine wave such as produced in a conventional oscillator, this portion of the grid voltage being determined by the voltage being fed back by the transformer and by the opposing charge being acquired by the condenser 22.

It will be seen that the grid voltage from $t$ to $t_4$ may be described as a damped wave of substantially sine wave form.

The time $t_5$ minus $t_4$, required for this discharge, which is represented by the line 60 and which may be referred to as a period of rest, is determined by the ratio existing between the value of the resistance 24 and the capacity of the condenser 22.

It will be assumed that, for correct operating action, each cycle is to start exactly at the point 61. In actual practice, it has been found expedient to so adjust the resistance 24 that the charge, at the potential E1, stored in the condenser leaks off in a manner represented by the dash line 62. It will thus be seen that, at the time $t_5$, the negative potential on the grid has not quite reached the value E2. At this instant, however, a sharp synchronizing impulse 63, impressed on the grid circuit, is effective to instantaneously raise the potential on the grid at least to or even slightly past the potential represented by the point 61, whereupon conditions will again be such that the plate can draw sufficient current to initiate the next succeeding operating cycle.

During the period $t$ to $t_3$, which is determined primarily by the natural period of the plate and grid windings of the oscillation transformer 21, the plate draws current.

The period $t$ to $t_5$ is that required for a complete operating cycle, and equals a scanning-line period in the horizontal deflection circuit and a picture-frame period in the vertical deflection circuit, or, in other words, equals the period of a saw-tooth current wave.

From the foregoing, it will be seen that, by exciting the grid circuit from the plate circuit, and by using the proper values of capacity and resistance, the oscillator is permitted to make only one complete oscillation during each complete operating period occupying the time $t$ to $t_5$. Only a single voltage peak, therefore, is developed. An electrical charge is stored in the condenser 22 during the period $t_1$ to $t_2$, and the stored charge is utilized at the end of this period to block the circuit against further oscillation during the period $t_4$ to $t_5$ of the cycle. The charge gradually leaks off by way of the resistance 24 during the period $t_4$ to $t_5$ to a point somewhat removed from the point 61, and the received synchronizing impulse 63 is utilized to elevate the potential to the point 61, or to a point slightly beyond the same, whereby the circuit is again free to oscillate once.

The current impulses developed in the plate circuit of the tube 20, as just explained, cause a saw-tooth voltage wave to appear across a condenser 35 and an impulse voltage wave to appear across a resistance 37, the condenser 35 and the resistance 37 being connected in series relation with respect to each other and comprising a network 34 connected in the plate circuit of the tube 20. The saw-tooth voltage wave appearing across the condenser 35 is attributed to the fact that the condenser is charged linearly through the relatively high resistance 36 connected to the potential supply source shown, and to the fact that, when the charge reaches a definite level, the condenser is discharged practically instantaneously by the sharp impulse of current which then passes through the tube 20. The saw-tooth voltage wave across the condenser 35 and the impulse voltage wave across the resistance 37 combine to form, across the network 34 and in the output circuit of the tube 20, a voltage wave 39 having a frequency of 4320 cycles. The voltage wave 39 is of the shape required to cause a saw-tooth current wave to pass through an inductive circuit. The wave 39, therefore, is amplified by a suitable amplifier tube 38 having its input circuit connected directly, as shown, to the output circuit of the tube 20, and having its output circuit connected to the horizontal deflecting coils 17 through which a saw-tooth current wave at 4320 cycles is caused to pass.

The vertical deflection circuit 30a operates in the same manner as the horizontal deflection circuit, and the various parts making up the former have been designated by the same reference numerals, with the suffix "*a*", as the respective and corresponding parts comprising the horizontal deflection circuit. In the circuit 30a the capacity of the blocking condenser 22a and the value of the associated resistance 24a are such that the period during which the plate of the tube 20a draws current is about one-fiftieth of the entire operating period of the oscillator circuit 19a. The circuit 30a causes a saw-tooth current wave 40a to pass through the vertical deflecting coils 18, and this wave is at 24 cycles as determined by the received framing impulses occurring at the rate of 24 a second and applied to the grid circuit of the tube 20a by the connection 49.

The ratios of the transformers 21 and 21a are such as to obtain the required amplitude of horizontal and vertical deflection of the ray 15. These ratios, however, are not critical.

In the specific embodiment of my invention disclosed in Fig. 1, it is intended that the transformer 21 be a two-to-one step-down transformer from plate to grid, and that the transformer 21a be a two-to-one step-up from plate to grid. In this embodiment, also, it is intended that the natural oscillation period of the windings of the transformer 21, due to distributed capacity effectively across the windings, be such that the time period of one-half cycle is less than one-tenth of a scanning-line period, and that the natural oscillation period of the transformer 21a be such that the time period of one-half cycle be about one-fiftieth of the frame period.

In describing the manner of operation of the embodiment of my invention disclosed in Fig. 1, it has been assumed, for example, that the picture signals and the synchronizing impulses are being transmitted in the same manner and by a transmitting system of the general character disclosed in the copending application of Ray D. Kell, filed September 30, 1931, bearing Serial No. 565,953, and assigned to the Radio Corporation of America. In such a system, the picture signals and the synchronizing impulses are transmitted in the same channel, with the impulses at a substantially greater amplitude than the picture signals. Both the horizontal and vertical impulses are transmitted at the same amplitude, but are of different shapes so that these impulses have substantially different steepness of wave fronts. The horizontal impulses are transmitted at the end of each picture line, and occur at the rate of 4320 a second, while the vertical impulses are transmitted at the end of each frame and occur at the rate of 24 a second.

At the receiving station, the picture signals and the synchronizing impulses appear across the resistance 13 in the form of a single wave. This wave is supplied to the input circuit of a suitable filter apparatus 32 which blocks the picture signals but passes the synchronizing impulses which are of substantially greater amplitude than the latter, as explained. The apparatus 32 is effective to distinguish between the horizontal and vertical impulses, and passes the former to the grid circuit of the tube 20 by way of a connection 51, and passes the latter to the grid circuit of the tube 20*a* by way of a connection 49.

As a possible modification, the resistance 36 may be so connected in shunt with the condenser 35 that this resistance then forms part of the network 34. Such a modification is shown in Fig. 2, wherein the various parts have been designated by the same reference numerals with the suffix "*b*" as the respective and corresponding parts comprising the circuit 30 in Fig. 1. The operating action of the circuit 30*b* is the same as that of the circuit 30. That is, the oscillator 19*b* operates to develop across the network 34*b* a voltage wave comprising a saw-tooth component, which appears across the condenser 35*b* and the resistance 36*b*, and an impulse component which appears across the resistance 37*b*. The modified circuit in Fig. 2 may also be used for the vertical deflection circuit 30*a* in Fig. 1.

Fig. 3 shows a modification wherein a screen-grid tube 20*c* is substituted for the tube 20*a* in the vertical deflection circuit 30*a* in Fig. 1. In this modification, the oscillating circuit is comprised of the screen grid, the grid and the cathode of the tube 20*c*, the screen-grid acting as a plate. The output circuit of the tube 20*c* is comprised of the plate and the cathode, with the screen grid acting as a control grid. The connections and manner of operation are, otherwise, the same as in the circuit 30*a*. The advantage of the circuit 30*c* is that the oscillator circuit 19*c*, due to the electronic coupling in the tube 20*c*, oscillates entirely independently of any other operating action in the entire circuit, and for this reason any adjustments or changes which might be made in the network 34*c*, to change the ratio of saw-tooth component to impulse component, will have no influence to cause a change in the frequency of operation of the oscillator circuit 19*c*.

The circuit in Fig. 3 may be modified by interchanging the respective connections to the plate and the screen grid of the tube 20*c*. In such case, the oscillating circuit will be comprised of the cathode, the grid and the plate, and the output circuit of this tube will be comprised of the cathode and the screen grid. The output circuit, in this modification, may be controlled by either the control grid or the plate, as might be found desirable on account of the mechanical construction of the tube.

In Fig. 1, the tube 20 may also be replaced by a screen-grid tube, as described in connection with Fig. 3.

My improved oscillator circuits 19, 19*a*, 19*b* and 19*c* may be used for many other purposes than the synchronization of deflection circuits in a television system. There is a great variety of commercial control systems requiring that a single, sharply-peaked control impulse reoccur faithfully at the beginning or ending of a definite time period. For example, in the art of maintaining clocks in exact synchronism with observatory time, a single, sharply-peaked control impulse reoccurring once at the same instant during minute periods, would be effective for this purpose. In such case, for example, the resistance 24 and the condenser 22 in the oscillator circuit 19 would be adjusted so that the complete operating period would be substantially one minute, and the received synchronizing impulses, for making this period exactly one minute, would correspond to the received timing impulses under control of the master clock.

The various values of resistance, capacity, inductance and voltage designated in the drawings have been found to provide for very satisfactory operation. However, these values are not critical in any strict sense of the word, and may be varied over a substantial range. Furthermore, in this connection, various other changes might be made such as in the circuit arrangement without departing from the spirit of the invention or the scope of the claims.

I claim as my invention:

1. In an electrical circuit for developing a voltage wave comprising a saw-tooth component and an impulse component, an electric discharge tube having a plate, a grid and a cathode, an input circuit connected between said grid and said cathode, an output circuit conductive to direct current connected between said plate and said cathode, said input circuit being excited from said output circuit in such manner that as the plate current increases the bias on the grid of said tube increases in the positive sense and as the plate current decreases said bias increases in the negative sense, an electrical network comprising a condenser and a resistance in series and connected across at least a portion of said output circuit, and means for charging said condenser substantially linearly whereby said saw-tooth component appears across said condenser and said impulse component appears across said resistance.

2. In an electrical circuit for developing a voltage wave comprising a saw-tooth component and an impulse component, an electric discharge tube having a plate, a grid and a cathode, an input circuit connected between said grid and said cathode, an output circuit conductive to direct current connected between said plate and said cathode, said input and output circuits including means for inductively coupling said circuits in such manner that as the plate current increases the bias on the grid of said tube increases in the positive sense and as the plate current decreases such bias increases in the negative sense, an electrical network comprising a condenser and a resistance in series and connected across at least a portion of said output circuit, and means for charging said condenser substantially linearly whereby said saw-tooth component appears across said condenser and said impulse component appears across said resistance.

3. In an electrical circuit for developing a voltage wave comprising a saw-tooth component and an impulse component, an electric discharge tube having a plate, a grid and a cathode, an input circuit connected between said grid and said cathode, an output circuit conductive to direct current connected between said plate and said cathode, said input circuit being excited from said output circuit in such manner that as the plate current increases the bias on the grid of said tube increases in the positive sense and as the plate current decreases said bias increases in the negative sense, a grid condenser connected in the input circuit of said tube, a grid resistor connected across said grid condenser to provide a discharge path for charges stored by said condenser, means for supplying control signals to said input circuit, said electrical circuit being characterized by the fact that the respective values of said grid condenser and said grid resistor and the constants and relation of the component parts are such that said tube draws plate current only once during each complete operating period thereof and for a relatively small part of such period, and being further characterized by the fact that during the time said tube draws plate current a charge is stored by said grid condenser sufficient to apply said potential to said grid for cut-off, an electrical network comprising a saw-tooth condenser and a resistance in series and connected across at least a portion of said output circuit, and means for charging said saw-tooth condenser substantially linearly whereby said saw-tooth component appears across said condenser and said impulse component appears across said resistor.

4. In an electrical circuit for developing a voltage wave comprising a saw-tooth component and an impulse component, an electric discharge tube having a plate, a grid and a cathode, an input circuit connected between said grid and said cathode, an output circuit conductive to direct current connected between said plate and said cathode, said input circuit being excited from said output circuit, means for applying control signals to said input circuit, said input circuit including a grid condenser and a grid resistor connected across said grid condenser, means including said grid condenser and said grid resistor for limiting the period during which said tube draws plate current to a relatively small part of each complete operating period of said tube, an electrical network connected in said output circuit and comprising a condenser and a resistance in series and connected across at least a portion of said output circuit, and means for charging said condenser substantially linearly whereby said saw-tooth component appears across said condenser and said impulse component appears across said resistance.

5. In an electrical circuit for developing an electrical wave comprising a saw-tooth component and an impulse component, a screen-grid electron tube having a grid-cathode circuit, a screen-grid circuit and plate circuit, said grid-cathode circuit being excited from its screen-grid circuit, means for applying control signals to the grid of said tube, an electrical network comprising a condenser across which said saw-tooth component appears and a resistance across which said impulse component appears and means for charging said condenser approximately linearly through a portion of said plate circuit, said condenser and said resistance being connected in series with each other and in shunt to said plate circuit portion whereby said condenser discharges periodically through said tube.

6. In an electrical circuit for developing a voltage wave comprising a saw-tooth component and an impulse component, an electric discharge tube having an anode, a control grid, a screen grid and a cathode, an output circuit conductive to direct current between said anode and said cathode, a screen grid circuit between said screen grid and said cathode, and a control circuit between said control grid and said cathode, said control circuit being excited from said screen grid circuit in such manner that as the current in said screen grid circuit increases the bias on said control grid increases in the positive sense and as such current decreases the bias on said control grid increases in the negative sense, a grid condenser connected in the control circuit of said tube, a resistance connected across said grid condenser to provide a discharge path for charges stored by said condenser, means for supplying control signals to said control circuit, an electrical network comprising a condenser and a resistance in series and connected across at least a portion of said output circuit, and means for charging said condenser substantially linearly whereby said saw-tooth component appears across said condenser and said impulse component appears across said resistance.

7. In an electrical circuit for developing a voltage wave comprising a saw-tooth component and an impulse component, an electric discharge tube having a plate, a grid and a cathode, an input circuit connected between said grid and said cathode, an output circuit conductive to direct current connected between said plate and said cathode, said output circuit being coupled to said input circuit in such phase as to produce oscillations, means for limiting the number of oscillations of said tube to one for each operating cycle, said last-named means comprising a grid condenser connected in said input circuit for storing an electrical charge during the oscillation period in each cycle and a grid resistor connected across said grid condenser to provide a discharge path for said charge during the remaining period of the cycle, and a network connected in parallel with a portion of said output circuit and comprising a saw-tooth condenser which is to be charged periodically and across which said saw-tooth component is to appear, and a resistance across which said impulse component is to appear, said saw-tooth condenser and said resistance being in series with each other, whereby the current representing said condenser charge flows periodically through said tube.

8. In an electrical circuit for developing a saw-tooth electrical wave, an electric discharge tube having a plate, a grid and a cathode, an input circuit connected between said grid and said cathode, an output circuit conductive to direct current connected between said plate and said cathode, said output circuit being coupled to said input circuit in such phase as to produce oscillations, means for limiting the number of oscillations of said tube to one for each operating cycle, said last-named means comprising a grid condenser in said input circuit for storing an electrical charge during the oscillation period in each cycle and a grid resistor connected across said grid condenser to provide a discharge path for said charge during the remaining period of the cycle, a saw-tooth condenser, and means for charging said saw-tooth condenser substantially linearly, said saw-tooth condenser being connected in parallel with at least a portion of said output circuit.

9. In an electrical circuit, an electric discharge tube having a plate, a grid and a cathode, said tube having a space path between said plate and said cathode, an input circuit connected between said grid and said cathode, an output circuit conductive to direct current connected between said plate and said cathode, said output circuit being coupled to said input circuit in such phase as to produce oscillations, means for limiting the number of oscillations of said tube to one for each operating cycle, said means comprising a grid condenser in said input circuit for storing an electrical charge during the oscillation period in each cycle and a grid resistor connected across said grid condenser to provide a discharge path for said charge during the remaining period of the cycle, and a condenser connected in parallel with at least a portion of said output circuit and in series with the space path of said tube whereby said last-named condenser is gradually charged during said remaining period and suddenly discharged through said tube at the end of said period.

10. In an electrical circuit for developing an electrical wave comprising a saw-tooth component, an electric discharge tube having a plate, a control grid, a screen grid and a cathode, a control circuit connected between said control grid and said cathode, a screen grid circuit connected between said screen grid and said cathode, a plate circuit connected between said plate and said cathode, said control circuit being excited from said screen grid circuit in such manner that as the screen grid current of said tube increases the bias on the control grid of said tube increases in the positive sense and as such current decreases the bias on said control grid increases in the negative sense, a grid condenser connected in the control circuit of said tube for applying to the control grid a potential more negative than that required for cut-off, a grid resistor connected across said plate condenser to provide a discharge path for charges stored by said condenser, means for supplying control signals to said grid circuit, an electrical network including a saw-tooth condenser which is to be discharged periodically through said tube and across which said saw-tooth component is to appear and means for charging said saw-tooth condenser substantially linearly through a portion of said plate circuit, said saw-tooth condenser being connected in a path in shunt to said plate circuit portion whereby said saw-tooth condenser discharges periodically through said tube.

11. An oscillator for producing electrical impulses periodically, said oscillator comprising an electric discharge tube having a plate, a grid and a cathode, a plate circuit connected between said plate and said cathode, and a grid circuit connected between said grid and said cathode, means comprising a transformer having a primary in said plate circuit and a secondary in said grid circuit for inductively coupling said circuits, said coupling being in such direction that said control grid is made more positive in response to an in-increase in plate current, a grid condenser connected in series with said secondary whereby said condenser receives a charge of the proper polarity and of sufficient magnitude to block said tube, a grid resistor connected across said grid condenser for causing said charge to leak off, the capacity and resistance values of said grid condenser and said grid resistor respectively being so high and the damping of said plate and grid circuits being so great that each cycle of operation of the oscillator includes a damped wave of substantially sine wave form followed by a period of rest, said damping being so great that said grid is driven positive only once during the occurrence of said damped wave, and a saw-tooth condenser connected across at least a portion of said plate circuit whereby it is gradually charged during said period of rest and suddenly discharged through said tube at the end of said period of rest whereby a saw-tooth voltage is produced thereacross.

12. An electrical circuit for generation of electrical impulses comprising an electric discharge tube having a cathode, a control grid and a plate, a plate-cathode circuit connected between said plate and said cathode, a grid-cathode circuit connected between said grid and said cathode, an inductance coil in said plate-cathode circuit and another inductance coil in said grid-cathode circuit, said coils being inductively coupled to each other and having capacity effectively thereacross, a grid condenser in series with the inductance coil in said grid-cathode circuit, resistance means for by-passing said grid condenser, the values of the several circuit elements being such that one complete cycle of operation includes one damped sine wave determined in frequency by the value of the product of said capacity and the inductance thereacross which is followed by a period of rest determined by the product of said by-pass resistance means and the capacity of said grid condenser, said rest period having been caused by the charge accumulated during the period of flow of grid current through said grid coil, said charge being of sufficiently high value to shut off the plate and grid currents in the tube until such time that the gradual leak of the said charge through said resistance means so reduces said charge and so lowers the bias of the control grid that the plate current may begin to flow again and the damped sine wave of the cycle may start over, a condenser across which a saw-tooth wave is to appear, means for coupling said last-named condenser across at least a portion of said plate-cathode circuit whereby it is charged gradually through a high impedance unit during said rest period and discharged suddenly through said tube at the end of said rest period.

13. A network for producing a saw-tooth wave, said network comprising a condenser, a plurality of circuits connected across said condenser, and means for charging said condenser through one of said circuits and discharging it through another of said circuits whereby a saw-tooth voltage appears across said condenser, an electric discharge tube having an anode, a grid and a cathode, said tube having a space path between said cathode and said anode, one of said circuits including said anode-cathode space path, a grid-cathode circuit between said grid and said cathode, the circuit which includes said space path being coupled to said grid-cathode circuit in such phase as to produce oscillations, means for limiting the number of oscillations of said tube to one for each operating cycle, said means comprising a condenser in said grid-cathode circuit for storing an electrical charge during the oscillation period in each cycle, said means also comprising a resistance so connected as to provide a discharge path for said charge during the remaining period of the cycle.

14. An oscillator for producing electrical impulses periodically, said oscillator comprising an electric discharge tube having a plate, a control grid and a cathode, said tube having a space path between said plate and said cathode, a plate circuit between said plate and said cathode, a grid circuit between said grid and said cathode, means comprising a transformer having a primary in said plate circuit and a secondary in said grid circuit for inductively coupling said circuits, said coupling being in such direction that said control grid is made more positive in response to an increase in plate current, a grid condenser connected in series with said secondary whereby said condenser receives a charge of the proper polarity and of sufficient amplitude to block said tube, a grid resistor across said grid condenser for causing said charge to leak off, the relative values of said grid condenser and said grid resistor being such and the damping of said plate and grid circuits being so great that each cycle of operation of the oscillator includes a wave of substantially sine wave form followed by a period of rest, said damping being so great that said grid is driven positive only once during the occurrence of said damped wave, a second condenser conductively connected in said plate circuit in series with the plate-cathode space path of said tube whereby said space path forms a portion of a circuit connected across said second condenser, a second circuit including a portion of said plate circuit conductively connected across said second condenser, and means in one of said two last-named circuits for charging said second condenser through one of said two circuits and discharging it through the other of said two circuits, whereby a saw-tooth voltage wave appears across said second condenser.

15. In an electrical circuit, an electric discharge tube having a plate, a grid and a cathode, a grid circuit connected between said grid and said cathode, a plate circuit conductive to direct current connected between said plate and said cathode, said plate and grid circuits being coupled in such phase as to produce oscillation, means for limiting the number of oscillations of said tube to one for each operating cycle, said means comprising a condenser in said grid circuit for storing an electrical charge during the oscillation period in each cycle, said means also comprising a resistance in said grid circuit to provide a discharge path for said charge during the remaining period of the cycle, and a condenser connected across at least a portion of said plate circuit whereby it is suddenly charged through said tube during said oscillation period and means for discharging said condenser substantially linearly during said remaining period.

16. An oscillator for producing electrical impulses periodically, said oscillator comprising an electric discharge tube having a plate, a control grid and a cathode, a grid circuit connected between said grid and said cathode, a plate circuit conductive to direct current connected between said plate and said cathode, means comprising a transformer having a primary in said plate circuit and a secondary in said grid circuit for inductively coupling said circuits, said coupling being in such direction that said control grid is made more positive in response to an increase in plate current, a grid condenser connected in series with said secondary whereby said condenser receives a charge of the proper polarity and of sufficient magnitude to block said tube, means comprising a grid resistor in said grid circuit for causing said charge to leak off, the relative values of said grid condenser and said grid resistor being such and the damping of said plate and grid circuits being so great that each cycle of operation of the oscillator includes a damped wave of substantially sine wave form followed by a period of rest, said damping being so great that said grid is driven positive only once during the occurrence of said damped wave, and a condenser connected in a path in shunt to at least a portion of said plate circuit so that it is suddenly charged through said tube during said oscillation period, and means for gradually discharging said condenser substantially linearly during said remaining period.

17. An electrical circuit for generating electrical impulses comprising an electric discharge tube having a cathode, a control grid and a plate, a plate cathode circuit between said plate and said cathode, a grid cathode circuit between said grid and said cathode, an inductance coil in said plate cathode circuit, a second inductance coil in said grid cathode circuit, said coils being inductively coupled to each other and having capacity effectively thereacross, a grid condenser in series with said second inductance coil, a grid resistor connected across said grid condenser, the values of the several circuit elements being such that one complete cycle of operation includes one damped sine wave determining the frequency by the value of the product of said capacity and the inductance thereacross which is followed by a period of rest determined by the product of the resistance of said grid resistor and the capacity of said grid condenser, said rest period having been caused by the charge accumulated during the period of flow of grid current through said inductance coil, said charge being of sufficiently high value to shut off the plate and grid currents in said tube until such time that the gradual leak of said charge through said grid resistor so reduces the said charge and so lowers the bias of the control grid that the plate current may begin to flow again and the damped sine wave part of the cycle may start over, a plate resistor in said plate-cathode circuit in series with said first inductance coil, and a condenser connected in series with said plate and cathode and in a path directly across said plate resistor whereby said last-named condenser is discharged gradually through said plate resistor during said rest period and charged suddenly through said tube at the end of said rest period.

18. In an electrical circuit for developing an electrical wave comprising a saw-tooth component, an electric discharge tube having a plate, a screen grid, a control grid and a cathode, a grid-cathode circuit between said control grid and said cathode, a screen grid circuit between said screen grid and said cathode, said grid-cathode circuit being excited from said screen grid circuit in such manner that as the screen grid current of said tube increases the bias on the grid of said tube increases in the positive sense and as such grid decreases the bias on said grid increases in the negative sense, a condenser connected in series in said grid-cathode circuit for applying to said control grid a potential more negative than that required for cut-off, a resistance connected in a path in shunt with said condenser to provide a discharge path for charges stored by said condenser, means for supplying control signals to said grid circuit, said tube having a plate circuit conductive to direct current between said plate and said cathode, a saw-tooth condenser connected in a path in shunt to at least a portion of said plate circuit, means for rapidly charging said saw-tooth condenser through said tube, and means for slowly discharging said saw-tooth condenser at the end of each charge.

19. A device for generating a current and voltage of saw-tooth wave form comprising, in combination, a vacuum valve provided with a filament, a control grid, a screen grid and a plate, a resistance, a condenser connected to a direct uum valve provided with a filament, a control tively slowly therefrom through said resistance and inserted between the plate and the filament of said vacuum valve so as to be discharged comparatively rapidly thereby, an oscillation coupling coil connected between said control grid and the filament of said vacuum valve, a condenser connected in series with said oscillation coupling coil, a resistance connected between said control grid and said filament, and another oscillation coupling coil connected between said screen grid and the filament of said vacuum valve through a direct current source so as to cooperate with said first mentioned oscillation coupling coil.

20. A device for generating a current and voltage of saw-tooth wave form comprising a vacuum valve provided with a filament, a control grid, a screen grid and a plate, a resistance, a condenser connected to a direct current source in order to be charged comparatively slowly therefrom through said resistance and inserted between the plate and the filament of said vacuum valve so as to be discharged comparatively rapidly thereby, an oscillation coupling coil connected between the control grid and the filament of said vacuum valve, a variable resistance connected between said control grid and said filament and a grid condenser connected in series with said oscillation coupling coil, and another oscillation coupling coil connected between the screen grid and the filament of said vacuum valve through a direct current source so as to cooperate with said first mentioned oscillation coupling coil, said oscillation coupling coils being wound cumulatively on a common iron core, and thus producing the impulsive and continuous oscillation of any desired frequency by adjusting the electric constant of said variable resistance and grid condenser combination.

WILLIAM A. TOLSON.

CERTIFICATE OF CORRECTION.

Reissue No. 20,338. April 20, 1937.

WILLIAM A. TOLSON.

It is hereby certified that error appears in the printed specification of the above numbered patent requiring correction as follows: Page 2, first column, line 44, for "line-scapping" read line-scanning; and page 8, first column, lines 14 and 15, claim 19, strike out "uum valve provided with a filament, a control tively" and insert instead current source in order to be charged comparatively; and that the said Letters Patent should be read with these corrections therein that the same may conform to the record of the case in the Patent Office.

Signed and sealed this 1st day of February, A. D. 1938.

(Seal)

Henry Van Arsdale,
Acting Commissioner of Patents.